United States Patent [19]

Higuchi et al.

[11] Patent Number: 4,835,598

[45] Date of Patent: May 30, 1989

[54] WIRING BOARD

[75] Inventors: Tooru Higuchi; Tosiyuki Yamaguchi; Takeshi Kanou, all of Kadoma, Japan

[73] Assignee: Matsushita Electric Works, Ltd., Osaka, Japan

[21] Appl. No.: 52,182

[22] Filed: May 14, 1987

Related U.S. Application Data

[63] Continuation-in-part of Ser. No. 796,557, Nov. 8, 1985, abandoned.

[30] Foreign Application Priority Data

Jun. 13, 1985 [JP] Japan .................. 60-128517
Jul. 12, 1985 [JP] Japan .................. 60-154756

[51] Int. Cl.⁴ ............... H01L 23/34; H01L 23/14; H01L 23/40
[52] U.S. Cl. .................... 357/72; 357/80; 357/81
[58] Field of Search .............. 357/80, 72, 81, 79; 174/52 FP, 16 HS

[56] References Cited

U.S. PATENT DOCUMENTS

| | | | |
|---|---|---|---|
| 3,825,803 | 7/1974 | Budde | 357/72 |
| 3,936,866 | 2/1976 | Grossman et al. | 357/80 |
| 4,150,393 | 4/1979 | Wilson et al. | 357/80 |
| 4,218,701 | 8/1980 | Shirasaki | 357/72 |
| 4,222,516 | 9/1980 | Badet et al. | 357/80 |
| 4,376,287 | 3/1983 | Sochi | 357/80 |
| 4,396,936 | 8/1983 | McIver et al. | 357/80 |
| 4,509,096 | 4/1985 | Baldwin et al. | 357/81 |
| 4,544,989 | 10/1985 | Nakabu et al. | 357/81 |
| 4,698,662 | 10/1987 | Young et al. | 357/81 |

FOREIGN PATENT DOCUMENTS

| | | | |
|---|---|---|---|
| 0068657 | 5/1980 | Japan | 357/74 |
| 0107063 | 7/1982 | Japan | 357/81 |

OTHER PUBLICATIONS

"Microcircuit Heat Sink"–Cherniack et al.–IBM Technical Disclosure Bulletin–vol. 8, No. 10, Mar. 1966., p. 1457.

Primary Examiner—Andrew J. James
Assistant Examiner—S. V. Clark
Attorney, Agent, or Firm—Koda and Androlia

[57] ABSTRACT

A printed wiring board for carrying a semiconductor chip including a resin base substrate having at least one opening therethrough, a thermo-conductive plate for mounting the semiconductor chip thereon, the plate being inserted into the opening, an insulating adhesive layer covering at least one side of the substrate and an electric circuit formed on the layer. The wiring board of this invention eliminates those disadvantages of the existing resin substrate type and metal core type. In essence, the wiring board of this invention displays excellent heat releasing capability and magnetic shield effect as well as reliable electric insulation.

8 Claims, 4 Drawing Sheets

WIRING BOARD

This is a continuation-in-part of application Ser. No. 796,557, filed Nov. 8, 1985, now abandoned.

BACKGROUND OF THE INVENTION

1. Field of the Invention

This invention relates to a semiconductor chip carrier and more particularly to a semiconductor chip carrier with a terminal and a method of fabricating a semiconductor chip carrier.

2. Prior Art

It has been the most common practice to mount a semiconductor chip on a lead frame as a carrier. However, recent technical innovation requires a substantially greater number of terminals for semiconductor chips. In order to better accommodate this requirement, an attempt has been made to use a printed wiring board as a chip carrier in lieu of a lead frame.

In the known art, the wiring boards used as a chip carrier are classified into two types based upon the characterisitcs of the substrates used therein.

The first type includes those substrates which are made primarily of resins, such as a resin plate and a laminated plate obtained by laminated-molding of pre-pregs which are prepared by drying after impregnating the base material with varnish of the thermosetting resin. The substrates of the first type are most widely used because they have the principal characteristics required for the substratres for wiring boards, such as having superior electric isulation. On the other hand, the high density of the contemporary semiconductor chips generates substantial heat therein and as a result, an escape for such heat has become a great concern. In addition, the noise level becomes annoying unless a magnetic shield is provided. In these regards, it has been recongnized that those first type substrates suffer from a lack of heat releasing capability and magnetic shield effect as well.

The second type includes those made of a metal plate as a core extending in the middle of the board and being referred to as a metal core board. The specific structure and performance of the metal core boards are extensively diclosed, for example, in IPC Standard 1985 by The Institute for Interconnecting and Packaging Electronic Circuits and the Hewlett-Packard Journal (August 1983). The substrates of the second type display a superior property regarding the heat releasing capability and the magnetic shield effect. However, they have an inherent disadvantage in securing electric insulation particularly between the leads and the metal core which are located very close to each other. This is particularly true with the LCC (Leadless Chip Carrier) type where terminals are located at the edge of the substrate and this structural often causes electric short circuits during soldering. Furthermore, electric short circuits may also occur at the edge of the substrate simply because of excessive moisture in the atmosphere.

In essence, those substrates of the first and the second types known in the art could not be made free from a disadvantage one way or the other; more specifically, unreliable electrical insulation or otherwise insufficient heat releasing capability and magnetic shielding effect.

SUMMARY OF THE INVENTION

This invention has been developed in an attempt to build a wiring board as a semiconductor chip carrier overcomeing all the disadvantages which the prior art has failed to solve.

Accordingly, it is the primary object of this invention to provide a wiring board as a semiconductor chip carrier which displays excellent heat releasing capability and magnetic shield effect in addition to electric insulation.

It is another object of this invention to provide a wiring board which is relatively inexpensive in manufacturing and reliable in use.

It is another object of the present invention to provide a wiring board with improved moisture resistance.

In keeping with the principles of this invention, the objects are accomplished by a unique structure of the wiring board including; (a) an insulating substrate having at least one opening, (b) a thermo-conductive plate for mounting a semiconductor chip thereon, said plate being located in the opening, (c) an insulating adhesive layer being applied at least one side of the substrate and (d) an electric circuit mounted on the insulating adhesive layer.

BRIEF DESCRIPTION OF THE DRAWINGS

FIG. 5, 6, 7, 8, 9, 10, 11, 12, 13 and 14 show a section view of the wiring boards of other embodiments of this invention.

DETAILED DESCRIPTION OF THE INVENTION

Figure 1:
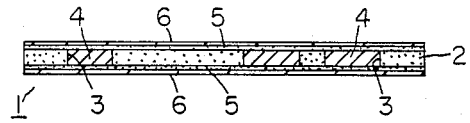
FIGS. 1 and 2 show a section view of an embodiment of the substrate of this invention.

Before the description of this invention proceeds, it is to be noted that like parts are designated by like reference numerals throughout the several views of the accompanying drawings. First referrring to FIG. 1, there is shown the basic form of the printed wiring board of this invention. In particular, a wiring board 1 has, in its center, an insulating substrate 2 made primarily of resin. The substrate 2 is provided with openings 3 into which a thermo-conductive plate 4 which in the following embodiments may also be described as a metal plate is firmly inserted. An insulating adhesive layer 5 is applied to cover the substrate 2 as well as the thermo-conductive plate 4. On top of the insulating adhesive layers 5, there is provided a laminated metal foil 6. Through the combined use of the resin and metal in the wiring board as structured above, the foregoing objects become attainable.

More specifically, the insulating substrate 2 may be structured in a form of a laminated plate or a solid resin plate made of paper, glass cloth, woven fabric, non-woven fabric and the like as the base material. The laminated plate may be prepared by laminating a number of prepregs obtained by drying the base material after it is impregnated with resin and the laminated prepregs are processed with the pressurization. The resins used for impregnating the base material include phenol resin, epoxy resin, unsaturated polyester resin, polyimide resin, fluororesin, polyphenylen sulfide resin and polyester resin. The solid resin plate aforementioned is obtainable by molding the resins listed above into a plate form.

Figure 2A:
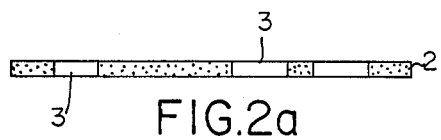
Figure 2B:
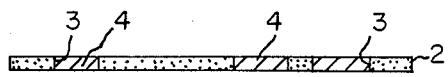
Figure 3:
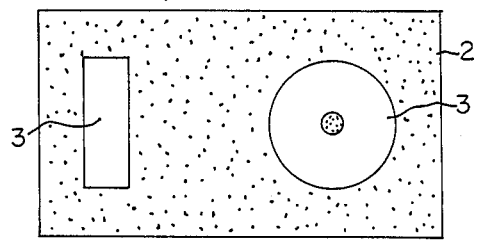
FIG. 3 shows a top view of an insulating substrate of this invention.

As seen in FIGS. 2 (a) and 3, the openings 3 provided in the insulating substrate 2 may be formed at a through-hole position or a terminal position. These openings 3 may take a form of a through hole or a non-through hole and even a concave cut-out at the edge of the base plate 2.

In regard to the thermo-conductive or metal plate 4, it can be made of any thermo-conductive material such as aluminum, brass, stainless steel, iron, nickel, copper, copper-invar-copper, 42 alloy plate and alloys thereof and the like.

As seen in FIG. 2 (b), the metal plate 4 is shaped into substantially the same configuration of the openings 3 so that the thermo-conductive plate 4 can be firmly inserted into the openings 3. An adhesive agent may be applied between the inner circumferential surface of the openings 3 and the outer circumferentail surfaces of the thermo-conductive plate 4 to secure as a contact therebetween. Since the thermo-conductive plate 4 is surrounded by the insulating substrate 2, the edge of the thermo-conductive plate 4 is not exposed at the end of the substrate 2 unlike the metal core board of the prior art. As a result, electric insulation between the leads of the electric circuit and the thermo-conductive plate 4 can be tightly secured.

After inserting the thermo-conductive plate 4 into the openings 3, a metal foil laminate 6 is applied over the both upper and lower surfaces of the insulating substrate 2 with an insulating adhesive layer 5 interposing therebetween. In particular, the insulating adhesive layer 5 provided on the upper surface is provided with openings 11 which are smaller than the openings 5 such that an internal flange 30 of insulating adhesive is formed. The metal foil laminate 6 is then processed with hot pressure molding to form a wiring board 1 as shown in FIG. 1. The material to be used for the insulating adhesive layer may be selected from the group as listed above. However, it should be noted that the metal foil laminate 6 may be replaced by any other appropriate means for forming a metal layer such as copper plating. Also, it should be noted that the metal foil laminate 6 may be applied only one side of the substrate 2 depending upon the use.

In the wiring board thus obtained, an electric circuit pattern 8 is formed by an ordinary process such as etching the metal foil laminate 6. Then a selected portion of the electric circuit pattern 8 formed in the metal foil laminate 6 and the insulating adhesive layer 5 is cut to the extent that the metal plate 4 is exposed allowing an elctronic part to be directly mounted on top of the thermo-conductive plate 4. Furthermore, moisture attacks by the provision of the internal flange 30 which is placed over the marginal portion of the thermo-conductive plate 4 are provided. That is, the internal flange 30 extends over the end of the interface between the thermo-conductive plate 4 and the substrate 1 to interrupt the moisture path at this end, inhibiting the moisture entry to the semiconductor chip 7 mounted on the same surface of the thermo-conductive plate 4, thus greatly improving the moisture resistance. Also, the internal flange 30 extending over the marginal portion of the thermoconductive plate 4 serves as a stopper to prevent displacement of the thermo-conductive plate 4 relative to the substrate 1 in the thickness direction thereof, assuring the chip 7 on the plate 4 to be kept at a fixed position relative to the electric circuit 8 on the substrate 1 and maintaining a stable connection by way of bonding wire 9 between the chip 7 and the electric circuit 8.

Figure 4:
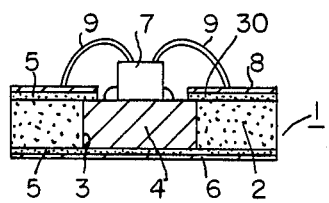
FIG. 4 shows a section view of an embodiment of the wiring board with a semiconductor of this invention.

FIG. 4 shows an embodiment of the wiring board 1 of this invention with a semiconductor chip 7 being mounted on the metal plate 4. The semiconductor chip 7 is connected to the electric circuit pattern 8 by bonding wires 9.

By this construction, the wiring board 1 of this invention provides the property of the resin substrate of high electric insulation as well as the property of the metal plate of heat escaping and magnetic shielding.

Figure 5:
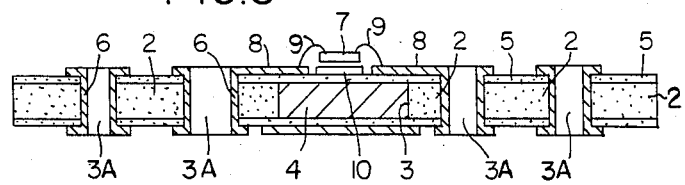
Figure 6A:
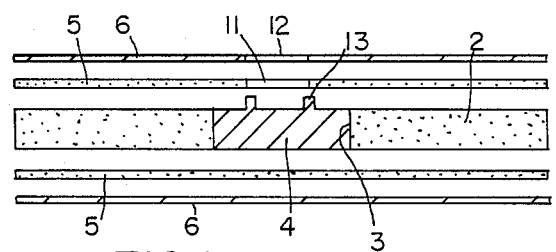
Figure 6B:
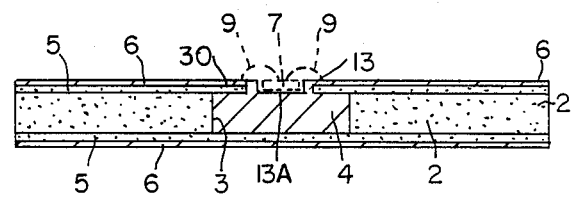

FIG. 5 shows another embodiment of this invention, where the semiconductor chip 7 is not directly mounted on the thermo-conductive plate 4. In particular, the semiconductor 7 is mounted on a die pad portion 10 which is located on top of the thermo-conductive plate 4 with the metal foil laminate 6 and the insulating adhesive layer 5 interposing therebetween.

The wiring board 1 may be shaped into a PGA (pin grid alley) type or the LCC (leadless chip carrier) type. In case the wiring board 1 with the semiconductor chip 7 is packaged the a PGA type, terminal pins are installed into the through holes 3A, 3A . . . formed in the substrate 2 as shown in FIG. 5.

Figure 6:
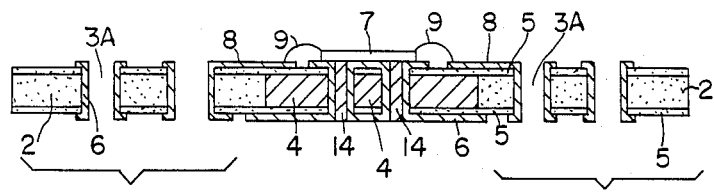

FIG. 6 (a) and (b) show still another embodiment of this invention, where the semiconductor chip 7 is surrounded by a wall extenting upward from the thermo-conductive plate 4. Particularly, FIG. 6 (a) illustrates the process of producing the printed wiring board 1, where both upper and lower side of the insulating substrate 2 with the opening 3 filled with the thermo-conductive plate 4 is to be covered with the insulating adhesive layer 5 and the metal foil laminate 6. The upper portion of the insulating adhesive layer 5 and the metal foil laminate 6 are provided with holes 11 and 12 respectively. The holes 11 and 12 are larger than the size of the wall 13 extending from the thermo-conductive plate 4 so that the wall 13 protrudes inside of the holes 11 and 12 but smaller than the openings 3 so that the internal flange 30 is formed. FIG. 6 (b) illustrates the way the semiconductor chip 7 is mounted on the thermo-conductive plate 4 with the wall 13 surrounding the chip 7. Thus, the semiconductor chip 7 is protected within a depression 13A defined by the wall 13 against moisture in the atmosphere and other undesirable effects.

Figure 7:
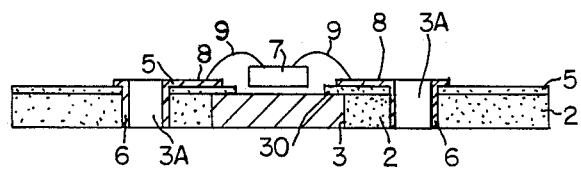

FIG. 7 shows another form of embodiment of this invention, where the lower side of the thermo-conductive plate 4 is exposed in the air. The semiconductor chip 7 is mounted on the thermo-conductive plate 4 which is not covered with any insulating material. As a result, this structure allows the thermo-conductive plate 4 to discharge heat generated in the semiconductor chip 7 without any hindrance.

FIG. 8 shows another embodiment of this invention, where a thermo-conducting memeber 14 is provided between the semiconductor chip 7 and the thermo-conducting plate 4. The heat generated in the semiconductor chip 7 is transmitted to the thermo-conductive plate 4 through the thermo-conductive member 14. In addition, the thermo-conductive member 14 would prevent the semiconductor chip 7 from being affected by any possible moisture in the substrate 2.

Figure 9A:
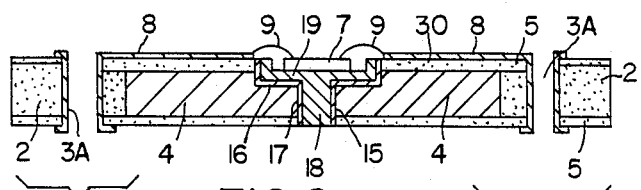
Figure 9B:
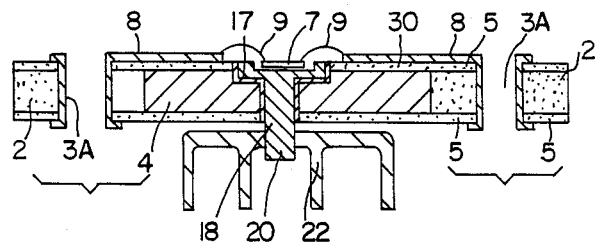

FIG. 9 (a) and (b) show another embodiment of this invention, where a thermo-conductive layer 17 and a metal carrier 18 are provided to improve the heat discharging capability. The thermo-conductive plate 4 is provided with an opening 15 in the center thereof such that the thermo-conductive plate 4 has a shoulder 16 extending within the opening 15. The thermo-conductive layer 17 made of resin compound including highly thermo-conductive material such as carbon and metal powder is laid along the inner side of the thermo-conductive plate 4. The metal carrier 18 made of iron-nickel alloy and the like is inserted into the opening 15 to sit on the thermo-conductive layer 17. The metal carrier 18 has an extended portion 19 lying on the shoulder 16 so that the semiconductor chip 7 may be mounted on top of the extended portion 19 as seen in FIG. 9 (a). The metal carrier 18 may be so designed as to have an extension 20 extending downwardly. The extension 20 is provided with a heat radiating member 21 having at least one fin 22. The fin 22 may be replaced with a heat pipe (not shown). In this embodiment, it is apparent that the heat generated in the semiconductor 7 is very efficiently discharged through the metal carrier 18 and the heat radiating member 21. In addition, undesirable discrepancy created by the difference in coefficient of thermal expansion between the metal carrier 18 and the thermo-conductive plate 4 can be absorbed by the thermo-conductive layer 7.

Figure 10:
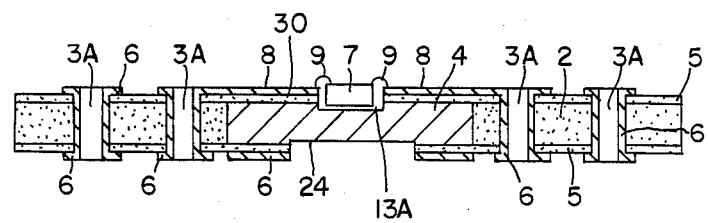
Figure 11:
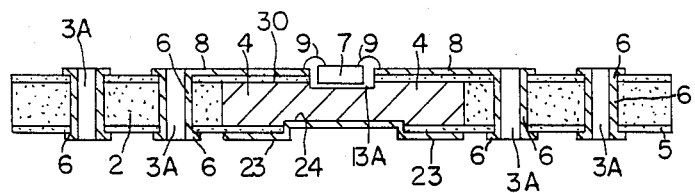
Figure 12:
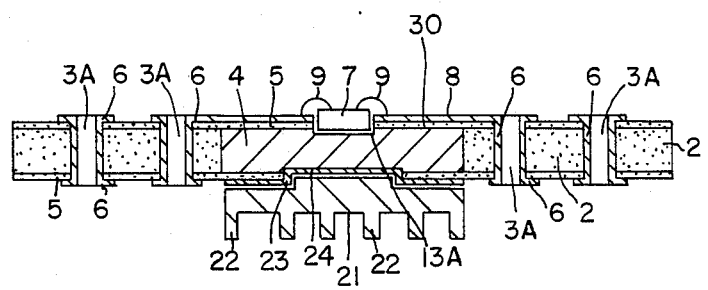

FIG. 10 to 12 show another embodiment, where the bottom side of the thermo-conductive plate 4 is provided with a depression 24. The structure shown in FIG. 10 has the depression exposed to the air, which allows the heat generated in the semiconductor chip 7 can be efficiently discharged through the exposed surface of the depression 24. FIG. 10 illustrates a variation which is further provided with a heat discharger 23 covering the depression 24. The heat discharger may be made by way of plating or coating a heat conductive metal such a copper, nickel, gold and the like. FIG. 12 illustrates still another variation which has a heat radiating member 21 upon the heat discharger 23. The heat radiating member 21 may include at least one fin 22 or heat pipe (not shown). Also a heat discharger (not shown) may be provided between the thermo-conductive plate 4 and the semiconductor 7.

Figure 13:
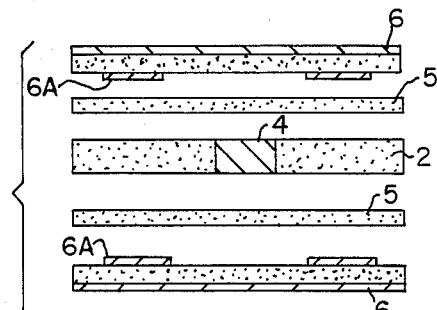
Figure 14:
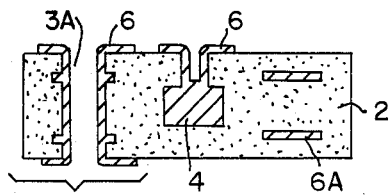

FIG. 13 and 14 shows another embodiment, where additional electric circuits 6A are provided between the inslulating adhesive layers 5. This structure allows to either single sided or doubled side circuit patterns within the wiring board 1. It is also possible to have them assembled without the additional electric circuits 6A. The material and process to produce this structure may be carried out with essentially the same manner as described above.

EXAMPLE

A 1 mm thick laminatedo fibre glass substrate impregnated with exposy resin (Nationalright Laminate R1600: manufactured by Matsushita Eectric Words, Ltd.) was provided with through holes at a preset location. 1 mm thick aluminum plates cut into substantially the same configuration as the abovementioned holes were inserted into the holes. On both upper and lower surfaces of the substrate, a fibre glass base epoxy resin prepreg with a thickness of 0.18 mm was applied respectively. Then, on top of the prepregs, copper foils of 0.018 mm in thickness were laid respectively. Through processing with hot pressure molding under the condition of 40 kg/cm2, 10 degrees centigrade and 60 minutes, a wiring board was obtained.

The table give below shows the coefficients of thermal conductivity for the cases where, as the metal substrate 1 of the printed wiring board 4, 42 alloy plate (Example 1), copper-invar-copper alloy plate (Example 2), and copper plate (Example 3) are used. For comparison, the coefficients of thermal conductivity are shown also for printed wiring boards using alumina plate (Comparison Example 1) and fibre glass epoxy plate (Comparison Example 2) as the substrate.

TABLE

| | Exp. 1 | Exp. 2 | Exp. 3 | Comp. Exp. 1 | Comp. Exp. 2 |
|---|---|---|---|---|---|
| Coefficient of Thermal Conductivity (cal/cm · °C. · sec) | $3 \times 10^{-2}$ | $3 \times 10^{-1}$ | $9 \times 10^{-1}$ | $5 \times 10^{-2}$ | $6 \times 10^{-4}$ |
| Coefficient of Water Absorption JIS C 6481 1.6 mm thick | $\rightleftarrows 0$ | $\rightleftarrows 0$ | $\rightleftarrows 0$ | $\rightleftarrows 0$ | $\rightleftarrows 0$ |
| Coefficient of Thermal Expansion (ppm/°C.) 30~250° C. | 4.5 | 5.0 | 17 | 6.0 | 14 |

I claim:

1. A semiconductor chip carrier comprising:
   an insulative substrate having at least one opening extending through the thickness thereof;
   a thermo-conductive plate in contact with the circumference of the opening inserted in the opening for supporting a semiconductor chip thereon; and
   an upper insulative adhesive layer and a lower insulative adhesive layer for electrical connection with the semiconductor chip; and
   wherein said conductive layer is provided with a hole extending through the thickness of the upper insulative adhesive layer in which the thermo-conductive plate is exposed, the lower insulative layer is provided with a hole in which the thermo-conductive plate is exposed and said holes of the insulative adhesive layers are dimensioned to be smaller than the opening of the insulative substrate so as to define along the inner circumference thereof internal flanges which are placed over the marginal portions of the thermo-conductive plate in direct contact relation therewith.

2. A semiconductor chip carrier according to claim 1, wherein said conductor layer extends to an edge of said insulative substrate.

3. A semiconductor chip carrier according to claim 1, wherein said insulative substrate is provided with at least one terminal hole.

4. A semiconductor chip carrier according to claim 2, wherein ends of said conductor layer extending to the edge of said insulative substrate is provided with terminals along said edge.

5. A semiconductor chip carrier according to claim 1, wherein said heat radiation surface is provided with an expansion metal plate thereby enlarging heat radiation capacity.

6. A semiconductor chip carrier according to claim 1, wherein said heat radiation surface is provided with a depression upon the surface thereof.

7. A semiconductor chip carrier comprising:
   an insulative substrate made of a laminate prepared by prepreg which is impregnated with a thermosetting resin, said insulative substrate having at least one opening extending through the thickness thereof;
   a thermo-conductive plate inserted in the opening for supporting a semiconductor chip thereon;
   hardened insulative adhesive layers formed with prepregs impregnated with a thermo-setting resin, said insulative adhesive layers covering the opposite surfaces of the insulative substrate over the thermo-conductive plate;

a conductor layer formed on the outer surface of at least the insulative adhesive layer adjacent to the semiconductor chip for electrical connection with the semiconductor chip; and each of the insulative adhesive layers being formed with a hole which is smaller than the opening of the insulative substrate so as to define along the inner circumference thereof an internal flange which is placed in direct contact relation over the marginal portion of the thermo-conductive plate, whereby the thermo-conductive plate is held between the internal flanges of the respective insulative adhesive layers while the surface of the thermo-conductive plate opposite to the semiconductor chip is exposed through the hole to define thereat a heat radiation surface.

8. A semiconductor chip carrier comprising:

an insulative substrate made of a laminate prepared by prepreg which is impregnated with a thermosetting resin, said insulative substrate having at least one opening extending through the thickness thereof;

a thermo-conductive plate inserted in the opening for supporting a semiconductor chip thereon;

hardened insulative adhesive layers formed with pre-pregs impregnated with a thermo-setting resin, said insulative adhesive layers covering the opposite surfaces of the insulative substrate over the thermo-conductive plate;

conductor layers formed on the outer surface of each of the insulative adhesive layers adjacent to the semiconductor chip for electrical connection with the semiconductor chip; and each of the insulative adhesive layers being formed with a hole extending through the thickness of both the insulative adhesive layers and the conductor layers, said holes being smaller than the opening of the insulative substrate so as to define along the inner circumference thereof an internal flange which is placed in direct contact relation over the marginal portion of the thermo-conductive plate, whereby the thermo-conductive plate is held between the internal flanges of the respective insulative adhesive layers while the surface of the thermo-conductive plate opposite to the semiconductor chip is exposed through the hole to define thereat a heat radiation surface.

* * * * *